United States Patent
Jaisimha et al.

(10) Patent No.: US 8,406,715 B2
(45) Date of Patent: Mar. 26, 2013

(54) METHOD AND APPARATUS FOR DYNAMICALLY ADAPTING FM TUNER SENSITIVITY TO A LOCAL ENVIRONMENT FOR A SINGLE-TUNER SYSTEM

(75) Inventors: Shree Jaisimha, Senioa, GA (US); Mohammad Kanji, Atlanta, GA (US); Donald Thomas, Smyrna, GA (US); Jason Hingerton, Atlanta, GA (US)

(73) Assignee: Panasonic Automotive Systems of America, division of Panasonic Corporation of North America, Peachtree City, GA (US)

( * ) Notice: Subject to any disclaimer, the term of this patent is extended or adjusted under 35 U.S.C. 154(b) by 1263 days.

(21) Appl. No.: 12/079,528

(22) Filed: Mar. 27, 2008

(65) Prior Publication Data
US 2009/0247099 A1 Oct. 1, 2009

(51) Int. Cl.
*H04B 1/18* (2006.01)

(52) U.S. Cl. .............. 455/161.1; 455/191.3; 455/226.2; 455/227; 455/229; 455/184.1

(58) Field of Classification Search .............. 455/254, 455/130, 132–135, 148, 168.1, 179.1, 180.1, 455/187.1, 188.1, 191.1, 226.1, 226.2, 226.3, 455/226.4, 230, 238.1, 277.2, 161.1, 161.3, 455/161.2, 164.1–167.1, 223, 227, 229, 231, 455/150.1, 151.1, 152.1, 154.1, 174.1, 182.1, 455/184.1

See application file for complete search history.

(56) References Cited

U.S. PATENT DOCUMENTS

| | | | | |
|---|---|---|---|---|
| 5,073,975 | A * | 12/1991 | Zarabadi et al. | 455/161.3 |
| 5,613,230 | A * | 3/1997 | Gottfried et al. | 455/161.3 |
| 5,859,664 | A * | 1/1999 | Dent | 348/21 |
| 5,867,044 | A * | 2/1999 | Mutz et al. | 327/77 |
| 5,933,097 | A * | 8/1999 | Sakurai et al. | 340/928 |
| 5,995,147 | A * | 11/1999 | Suzuki | 375/240.01 |
| 6,389,270 | B1 * | 5/2002 | Nohrden et al. | 455/161.1 |
| 6,842,609 | B2 * | 1/2005 | Davis et al. | 455/161.3 |
| 6,963,553 | B1 | 11/2005 | Cordier et al. | |
| 7,369,825 | B2 * | 5/2008 | Slupe | 455/161.3 |
| 2006/0092918 | A1 * | 5/2006 | Talalai | 370/352 |
| 2006/0121868 | A1 | 6/2006 | Jutori | |
| 2007/0036176 | A1 * | 2/2007 | Quigley et al. | 370/468 |

FOREIGN PATENT DOCUMENTS

| | | |
|---|---|---|
| EP | 0845873 A1 | 6/1998 |
| EP | 845873 A1 * | 6/1998 |
| EP | 1271816 A2 | 1/2003 |
| WO | 9820635 A2 | 5/1998 |

* cited by examiner

*Primary Examiner* — Pablo Tran
(74) *Attorney, Agent, or Firm* — Laurence S. Roach (57) ABSTRACT

A method of operating a single-tuner radio includes tuning into a first frequency. A pause in a first signal associated with the first frequency is detected. Tuning is switched from the first frequency to a second frequency. A signal quality metric for the second frequency is measured. Tuning is switched from the second frequency to the first frequency.

9 Claims, 9 Drawing Sheets

METHOD AND APPARATUS FOR DYNAMICALLY ADAPTING FM TUNER SENSITIVITY TO A LOCAL ENVIRONMENT FOR A SINGLE-TUNER SYSTEM

BACKGROUND OF THE INVENTION

1. Field of the Invention

The present invention relates to radios for use in vehicles, and, more particularly, to sensitivity settings in radios for use in vehicles.

2. Description of the Related Art

With car radios becoming more widely dispersed around the world, it is becoming more advantageous for the radios to detect characteristics of their environment and adjust internal settings of the radios accordingly. Currently most digital AM/FM tuners utilize a fixed tuner sensitivity threshold for the Tuner Auto Seek operation, i.e., the operation wherein the tuner automatically scans across a frequency band until it comes to, and stops at, a frequency having a sufficiently strong signal. Most digital AM/FM tuners also utilize fixed parameters for other functions. The use of fixed tuner sensitivity thresholds and fixed parameters may result in audio quality that is uneven under different signal conditions. The fixed threshold and parameters values are typically defined within the calibration data according to region.

In the case of the tuner sensitivity threshold, while a lower threshold value may enable the radio to better differentiate between noise and a valid station, the use of a fixed higher level threshold may limit the ability of the radio to identify valid stations via the Auto Seek operation as the driver travels from an urban to a suburban or rural surrounding environment. The lowered ability to identify valid stations via the Tuner Seek operation could arise because, in the suburban or rural environment, the radio may receive only lower signal levels that are below the actual threshold that is set for the upper limit.

Some of the other functions for which most digital AM/FM tuners utilize fixed parameters include Soft Mute, High Cut, and Stereo Blend. Soft Mute may be used in low signal sensitivity conditions to mute the audio in order to prevent static noise from disturbing the listening comfort of the end user. High Cut likewise defines the clamping down of high frequencies in cases where signal strength, multipath or adjacent channel is beyond a specified level. Stereo Blend also enhances the overall listening experience of the user in harsh environments by blending the stereo signal to a mono signal, and converting the signal back from mono to stereo when the signal conditions get better.

In the operation of a digital signal processor (DSP), an "attack time" may define the rate at which bandwidth increases, and "release time" may define the rate at which bandwidth shrinks. Conventional AM/FM tuners set fixed attack and release times for the Soft Mute, Stereo Blend and High Cut features. However, the attack time and release time for Stereo Blend, for example, that are optimized for high sensitivity regions might not work well for low sensitivity regions.

A radio convention or standard that differs between regions of the world is the use of Radio Data System (RDS) and Radio Broadcast Data System (RBDS). RDS is a standard from the European Broadcasting Union for sending small amounts of digital information using conventional FM radio broadcasts. The RDS system standardizes the transmission format of several types of information, such as the time of day and identification of the track, artist and radio station. RBDS is the United States version of RDS. With regard to RDS/RBDS sensitivity, the radio typically requires a certain field strength sensitivity before RDS/RBDS synchronization can be achieved in order to receive Program Identification Code, Program Service Name, Alternate Frequency List and others which are defined in the RDS/RBDS standard protocol. The sensitivity may have dependencies on characteristics of the wireless environment including front-end filter bandwidth, field strength, multipath and adjacent channel interference to which the currently listened-to station is subjected.

Conventional automotive radio head units store two Tuner Seek sensitivity threshold settings, namely, the Local and DX threshold settings, for the Tuner Auto Seek operation within calibration data. A local Seek operation typically maintains a higher threshold and, during triggering of Seek, the first pass utilizing this higher threshold may try to find station signals that meet or exceed this threshold level. If a signal exceeding the threshold level cannot be found after completing one pass across the entire spectrum range (87.7 MHz to 107.9 MHz in the U.S.) with the Local threshold, a DX threshold, which is lower than the Local threshold, may be utilized to find stations whose signal exceeds the lower DX threshold.

Due to the need to scan first with the Local threshold and scan again with the DX threshold, conventional radios typically require two passes in low sensitivity areas in order to find a station that meets the DX threshold in the event that no station exists that meets the Local threshold. In rural areas, these two scans require the user to wait for up to sixteen seconds assuming that seek speed is 75 milliseconds per station. That is, the U.S. FM band has 102 frequencies, and spending 75 milliseconds on each of these frequencies requires about eight seconds in order to complete one scan.

Accordingly, what is neither anticipated nor obvious in view of the prior art is a method of setting threshold values while in a non-tuner mode of operation, and without having to make two separate scans of the frequency spectrum. What is also neither anticipated nor obvious in view of the prior art is any means to adaptively increase the gain on the IF signal, alter the front end bandwidth bounds, and adjust the high cut filter bandwidth.

SUMMARY OF THE INVENTION

The present invention provides a method for the radio head unit to gauge the overall sensitivity of the region it is in by performing sensitivity checks which are not perceptible by the end user in either of the Tuner mode and the non-Tuner mode. Thus, tuner sensitivity may be dynamically adapted based on the local environment. The invention provides a method and system to dynamically adapt the tuner sensitivity, audio sensitivity and RDS/RBDS sensitivity to match the local sensitivity of the environment in which the radio is presently located.

In the case of a low sensitivity region, in order to improve RDS/RBDS sensitivity, the radio may adaptively enable or disable Intermediate Frequency (IF) gains of up to 6 dBuV based on the current sensitivity of the region in which the radio is presently located.

Audio parameter tweaking on radio head units for audio sensitivity settings may involve parameters for Stereo Blend, Soft Mute and High Cut which may enhance the experience of listener comfort during the drive. Audio listening comfort may also depend upon dynamically adapting the front end IF filter bandwidth. In cases of low signal quality that could be caused by adjacent channel interference, the front end IF filter bandwidth may be clamped down to ensure that the interference is cut out. While this may improve audio listening comfort, if the minimum bandwidth is kept too narrow it may indirectly affect the RDS synchronization and decoding of the RDS/RBDS signal which exists in the 57 kHz subcarrier of the FM Stereo Multiplexed (MPX) signal.

The invention comprises, in one form thereof, a method of operating a single-tuner radio including tuning into a first frequency. A pause in a first signal associated with the first frequency is detected. Tuning is switched from the first frequency to a second frequency. A signal quality metric for the second frequency is measured. Tuning is switched from the second frequency to the first frequency.

The invention comprises, in another form thereof, a method of configuring a tuner, including scanning a range of radio frequencies. A signal quality metric is measured for each of a plurality of the frequencies. A mean value and standard deviation of the plurality of measurements of the signal quality metrics are computed. A set of operational frequencies is selected for the tuner. The selecting is dependent upon the computing step.

The invention comprises, in yet another form thereof, a method of operating a single-tuner radio including tuning into a first frequency. A pause in a first signal associated with the first frequency is detected. Tuning is switched from the first frequency to a second frequency. A signal quality metric for the second frequency is measured. Tuning is switched from the second frequency to the first frequency. Distances traveled by the vehicle are monitored. The signal quality metric for the second frequency is enabled to again be measured only if the vehicle has traveled a threshold distance since the previous measurement of the signal quality metric for the second frequency.

An advantage of the present invention is that the radio is able to gauge the current local environment, which among other things, enables the RDS/RBDS sensitivity to be improved.

Another advantage is that the present invention may overcome the difficulty of performing quality checks while in tuner mode by making the checks imperceptible to the user. Particularly, the tuner sensitivity checks may be performed in both FM Tuner source and Non-Tuner source. Checks in FM source may be intelligently and opportunistically performed whenever the DSP detects a pause.

A further advantage is that, in order to limit the amount of checks and ensure that they are done efficiently, each quality check update may be associated with a timer which may be decremented by the speed of the vehicle. In one embodiment, if a quality check has been performed on a particular frequency, a quality check is again performed on the same station if and only if the timer has expired. A one-shot timer may ensure that consecutive checks are not performed back to back in order to avoid the audio being muted long enough for the user to be able to perceive the checks.

Yet another advantage is that the present invention may enable improved Tuner, Audio and RDS/RBDS sensitivity of the radio.

A further advantage is that the present invention may be applicable to any AM or FM digital tuner system.

Still another advantage is that the present invention removes the requirement of going through two passes or being in a non-tuner source in order to be able to adjust threshold.

A still further advantage is that, while the invention may assist the Auto Seek operation by adapting its threshold dynamically, the application of the invention can be extended to provide dynamic threshold settings for additional features requested by OEM customers such as Autostore Presets and dynamic station lists. For example, Autostore is a feature which may require the radio to scan the entire spectrum and store the twelve best frequencies onto RAM in order for the frequencies to be recalled by the user when needed.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
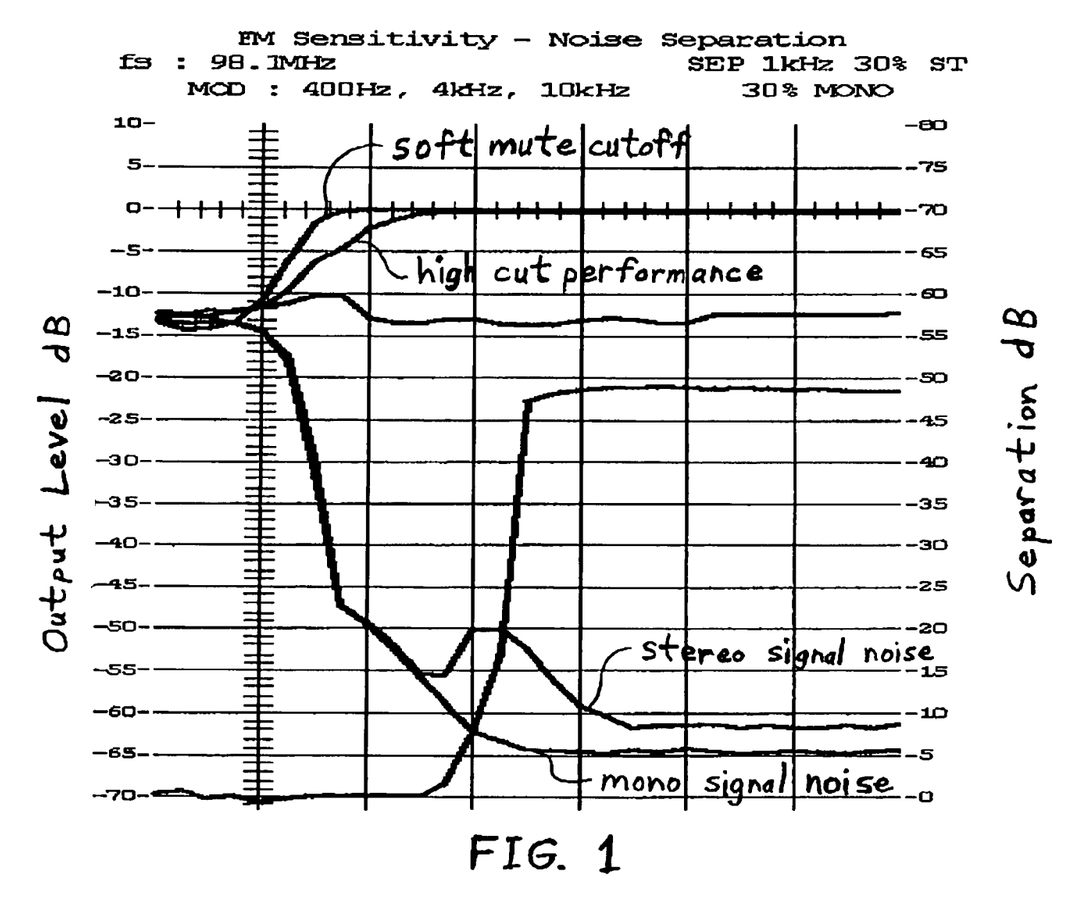
FIG. 1 is a set of plots of FM Tuner Sensitivity.

Referring now to the drawings, and particularly to FIG. 1, there is shown typical FM tuner sensitivity curves which plot the signal level in dBuV (x-axis) versus the signal-to-noise ratio (y-axis). The various plots include the High Cut performance for a particular radio, the Soft Mute cutoff, the Stereo signal noise and the mono signal noise levels.

The settings of the Soft Mute, High Cut and Stereo Blend parameters typically have variance based on the local sensitivity of the environment in which the radio head unit is presently located. These settings typically vary based on antenna type (i.e., passive, active or diversity) and region. For example, High Cut values can vary based on high and low sensitivity regions.

The above-mentioned parameters typically vary per region and may also vary based on the overall sensitivity of the region in which the car radio is presently located. Field testing may be used to identify a unique set of coefficients that satisfies performance requirements for both low and high sensitivity regions.

The present invention may provide a framework for the radio to scan the neighboring frequencies from the currently listened-to station and compute the standard deviation of a signal parameter, such as signal strength, about the mean value. The radio may utilize this information for setting the dynamic threshold for the Seek stop, i.e., for setting a signal parameter threshold wherein the tuner is caused to stop at a frequency if the signal parameter of the frequency exceeds the threshold. The radio may also load into memory the appropriate set of audio coefficients, i.e., signal parameter thresholds, for each region. With the present invention, there may no longer be a need to do a second pass scan for the DX threshold. Rather, the radio can utilize a single threshold which dynamically varies based on the measured characteristics of the local environment. For audio sensitivity tuning, the invention may enable the radio to dynamically load separate sets of coefficients, i.e., separate sets of threshold values, based on whether the car is located in a high sensitivity or low sensitivity region.

If the radio is able to gauge the sensitivity of the region in which it is located, or if the radio is able to ascertain the current sensitivity of the currently listened-to station, then the radio may dynamically enable and disable the Intermediate Frequency signal gain of up to 6 dBuV at the Tuner IC. In cases of low signal quality that could be caused by adjacent channel interference, the front end IF filter bandwidth may be clamped down in order to cut out the interference. While this may assist in audio listening comfort, if the minimum bandwidth is kept too narrow it can indirectly affect the RDS synchronization and decoding of the RDS/RBDS signal which exists in the 57 kHz subcarrier of the FM MPX signal.

Knowing the sensitivity of the region can also enable the radio to increase its front end bandwidth when it is, for example, in non-Tuner Source so that the RDS/RBDS background scanning can be done in a manner that is beneficial for RDS/RBDS sensitivity. The minimum bandwidth may be kept wide enough to not suppress the 57 kHz FM MPX subcarrier signal.

In conventional radios, enabling or disabling the IF gain feature or altering the front end IF filter bandwidth is a static feature which is configured only during manufacturing and which remains fixed after manufacturing. The present invention provides a means to adaptively increase the gain on the IF signal, which can improve the RDS/RBDS sensitivity under certain circumstances when multipath and ultrasonic noise is within certain limits, and if the radio is able to gauge the current local environment. The term "certain circumstances" is used above because IF gain should be used carefully as apart from amplifying the signal. Particularly, IF gain can also amplify the noise if there is high multipath and adjacent channel noise, which could have an overall detrimental effect on audio quality.

The present invention provides a method to perform background checks while in tuner FM source. A radio system 20 (FIG. 2) of the present invention may include a microcontroller 22 that may be used to process user input. A digital signal processor (DSP) 24 may be used to provide audio demodulation of the air-borne IF input signal. DSP 24 may also be used to provide quality information parameters to the main microcontroller 22 via a serial communication protocol such as I2C. The quality information parameters may include multipath, adjacent channel noise, and field strength. DSP 24 may rely on a Tuner IC 26 to perform the front end RF demodulation and the gain control. Tuner IC 26 may also output the Intermediate Frequency to DSP 24 where the Intermediate Frequency may be demodulated and processed. Tuner IC 26 may further provide a gain to the IF (Intermediate Frequency) of up to 6 dBuV prior to forwarding the signal to DSP 24. Communication between Tuner IC 26 and DSP 24, as indicated at 27, may be via a serial communication protocol such as I2C, which may operate at 400 kbps.

Figure 2:
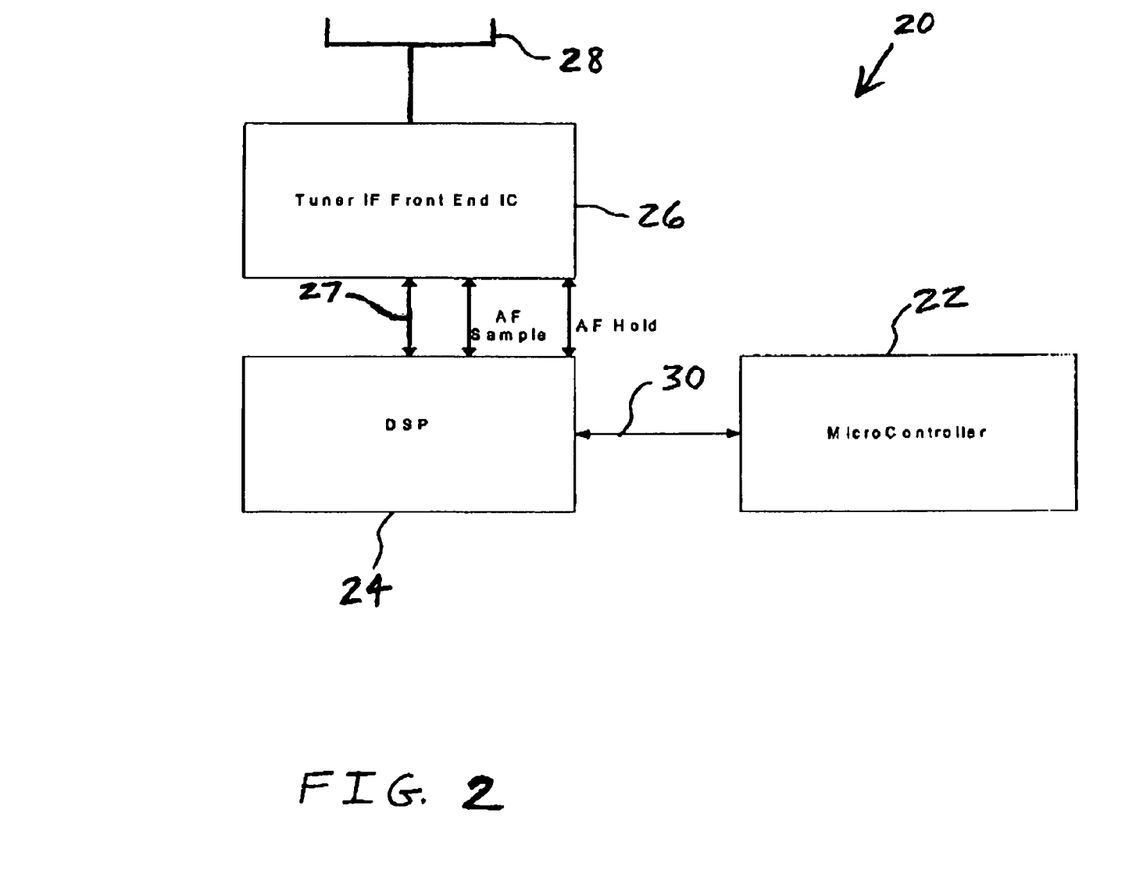
FIG. 2 is a block diagram illustrating one embodiment of a radio system of the present invention.

An antenna system 28 may be communicatively coupled to Tuner IC 26. Antenna system 28 may be in the form of a passive mast, or an active mast of phase diversity, for example.

DSP 24 may provide signal quality parameterization of demodulated tuner audio and may make it available to microcontroller 22 via a serial bus 30. In one embodiment, serial communication bus 30 is in the form of a 400 kbps high speed I2C.

The signal parameterization may include field strength, multipath and ultrasonic noise. Field strength may give an indication of signal reception and may help determine whether the radio station has good signal coverage in the vicinity of the user. This field strength quality parameter may be applicable for both AM and FM modulation signal reception.

Although the signal can have high field strength, it can be subject to reflections which can arise from trees and tall building which reflect/deflect the signal. The multipath parameter may enable the level of multipath to be ascertained, and may affect reception quality. The multipath quality parameter may be applicable for both AM and FM modulation signal reception.

Many times stations can overmodulate their signal leading to adjacent channel interference. For example, in the U.S., FM frequencies are spaced apart 200 kHz. Adjacent channel interference can lead to ultrasonic noise in cases where a neighboring station that is next to a currently listened-to station has a high field strength. The high field strength may result in the neighbor station's spectrum overlapping with that of the currently listened-to station, thereby causing audio distortion. Ultrasonic noise may typically be detected by the DSP if the DSP detects harmonics past the 150 kHz band after IF demodulation.

A novel feature of the present invention is the sampling of FM signals while the user is listening to an FM signal as the current foreground source. The difficulty associated with performing the sensitivity check while in FM mode, especially in a single tuner environment, is that the tuner to which the listener is listening has to momentarily switch to another station, perform the quality check, and then re-tune to the listened-to station. The user is not able to listen to the station during the time period between the switching of the station and the re-tuning of the station. This interruption in the signal of the listened-to station may be perceptible by the user, and thus may be a source of annoyance to the user.

If the audio system is in compact disc (CD) or non-tuner source, the bandscan checks of the frequencies can easily be performed as the tuner can perform the checks without the checks being perceptible to the user since the user is listening to a non-tuner source. To be able to perform the checks in an imperceptible manner, the present invention may utilize a DSP including pause detection logic that is able to detect pauses (i.e., periods of silence or unvoiced activity) in the demodulated audio stream. In one embodiment, pause is detected by computing the number of zero crossings in a particular window of time, wherein a zero crossing may be defined as the value of the signal strength dropping to zero or nearly zero. In another embodiment, pause is detected by utilizing a signal strength threshold below which the audio may be characterized as being in a pause. In one embodiment, a pause may be recognized when the duration of the pause exceeds about 40 milliseconds.

It may be assumed that the longer the period of time that a pause has gone on, the longer the period of time that the pause will continue in the future. Thus, a quality check may be initiated after a pause has gone on for a predetermined period of time, such as 40 milliseconds, on the assumption that the pause is more likely to continue long enough for the quality check to be completed.

Each recognized pause may interrupt the main microprocessor, which may then query a neighboring frequency for the quality value of the neighboring frequency. The quality value may be a function of multipath, signal strength and/or adjacent channel noise (also termed "ultrasonic noise").

Figure 3:
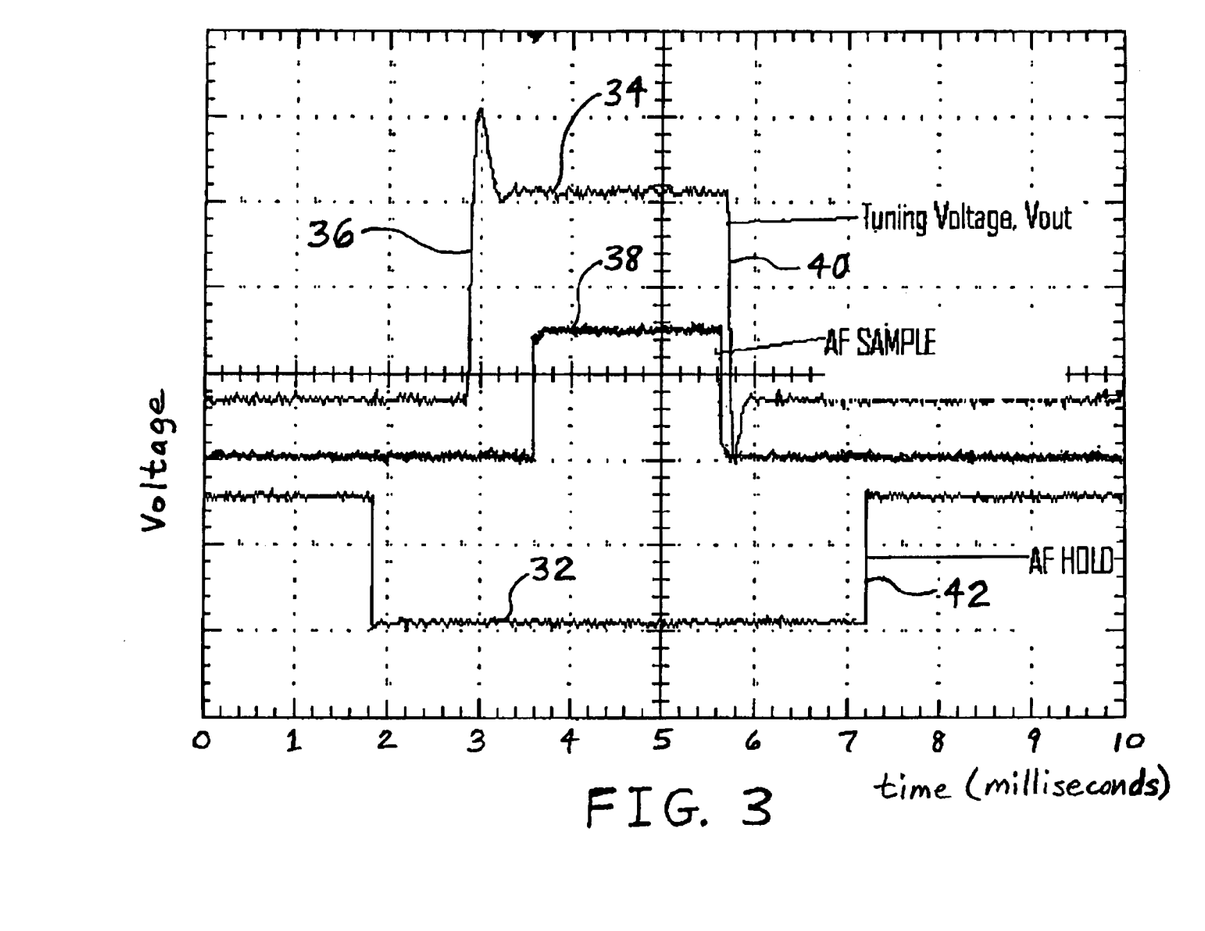
FIG. 3 is a timing diagram depicting the muting during a neighbor frequency check.

FIG. 3 is a timing diagram depicting the muting during a neighbor frequency check triggered by the pause detection logic of DSP 24. The muting may occur while the audio frequency (AF) Hold line is LOW, as indicated at 32. In the example illustrated in FIG. 3, the neighbor frequency check indicated at 32 has a duration of about 5.2 milliseconds using tuner IC 26 interacting with DSP 24. The magnitude of the tuning voltage may be dependent on the neighbor frequency jump, i.e., on the frequency difference between the currently listened-to frequency and the neighbor frequency to be checked. The overall time required to perform a neighbor check may be about seven milliseconds in one embodiment. The AF Hold line may go LOW in order to mute the audio prior to the actual tuning of Tuner IC 26 to the particular neighboring frequency, which tuning is indicated at 34. After the commencement of tuning, as indicated at 36, about one millisecond may be provided for settling of phase-locked loop (PLL) locking prior to actual sampling being performed during the time that the AF Sample line goes HIGH, as indicated at 38. After the quality AF Sample check, the tuning frequency may be set back to the originally listened-to station, as indicated at 40. After the tuning frequency is set back, time may be provided for PLL setting before the AF Hold Line goes HIGH, as indicated at 42, to unmute the audio of the presently listened-to station.

In one embodiment, after tuner IC 26 has switched to the neighboring frequency, as indicated at 34, the quality sample check is performed to gather readings of the three parameters of fieldstrength, multipath and ultrasonic noise. The readings may be gathered via an I2C bus which is set at 400 kbps. In order to promote fast access and avoid having to make three consecutive I2C reads from three separate and disparate memory locations in the DSP for the fieldstrength, multipath and ultrasonic noise parameters, DSP 24 may support calling the three registers which hold this information through one I2C read. In order to enable the single I2C read, DSP 24 may support autoincrement and the ability to map disparate memory locations via pointer access. These features may be instrumental in performing the quality sample check within the stipulated time frame and in avoiding the mute, i.e., the interruption of the audible broadcast, from being perceived by passengers of the vehicle.

When the quality sample check is performed on the neighboring frequency, the audio is muted for up to 5.2 milliseconds, i.e., the approximate duration of 32 in FIG. 3, which may be imperceptible by the user. However, it should be noted that the actual timing may vary based on the actual frequency jump from the currently listened-to frequency to the frequency being sample-checked. A relatively long jump (e.g., from 87.7 to 107.9 MHz as compared to a relatively short jump from 87.7 to 90.0 MHz) may require greater PLL (Phase Lock Loop) locking time. In one embodiment, the upper bound of the time needed to conduct a quality sample check is about seven milliseconds, which may be imperceptible to the end user.

The actual time taken to complete a full band search may be dependent upon a number of times a pause is detected. Based on empirical measurements taken in the field, there may be up to fifteen pause detects in a one minute period for radio talk shows.

When the audio system is in tuner mode, each quality sample check may take about seven milliseconds, which may be imperceptible to listeners so long as the quality sample checks are not performed consecutively, i.e., back to back, with no breaks in between. In one embodiment, precautions may be added in order to prevent or inhibit consecutive quality sample checks from being performed. Otherwise, consecutive performance of the checks could result in an interruption of the audible broadcast of greater than seven milliseconds, which could be perceptible to the end user listeners.

The present invention may be utilized in a real time multi-threaded environment. A real time embedded system such as a car radio may have many threads running consecutively. Since the quality sample check may advantageously be done quickly so that the user does not perceive it, in one embodiment, the present invention uses an event thread handler. The event thread handler may be triggered by an event flag. The event flag may be set whenever a pause detect interrupt occurs. In one embodiment, the event thread handler runs at a higher priority and thus can preempt the current thread of execution, resulting in real time deterministic processing on the order of about 300 microseconds.

In one embodiment, the radio may determine the sensitivity of the radio's present locality via a full band search. A full band search may provide better resolution for the standard deviation, but it may require more processing. In one embodiment, a full band search is conducted only if the user has been locked onto a station for a long period of time, i.e., for a period of time that exceeds a threshold period of time. In a full band search, up to 102 frequencies may be checked in a U.S. region because there are a total of 102 possible stations in the U.S. FM band (87.7 to 107.9 MHz with 200 kHz spacing). When in this particular search, the computation of the dynamic threshold may utilize the following formula if a full band search is to be performed:

$$\sigma = \left(\frac{1}{n}\left(\sqrt{\sum x^2 - (\sum x)^2}\right)\right) \qquad (1)$$

wherein x represents the individual field strength of each of the n frequencies computed in the scan, and a is the standard deviation, which may be a bias estimator. The larger the sample size, the lower the variance may be. The variable n represents the total number of frequencies scanned.

In one embodiment, the value of n may be calibrated. For example, in the case of the U.S. FM frequency spectrum, the variable n may take on the value of 102, which is the number of possible frequencies between 87.7 and 107.9 MHz, with a spacing between stations of 200 kHz.

The dynamic higher bound threshold value for the field strength may be computed using the following formula:

$$\text{Threshold} = \bar{x} = \left(\frac{1}{n}\left(\sum x\right)\right) \qquad (2)$$

In another embodiment, the radio may determine the sensitivity of the radio's present locality via use of a limited search mode. A limited search mode may provide a lower resolution for the standard deviation. The radio may enter the limited search mode under any of several different circumstances. For example, the radio may conduct a limited search in the event that, upon the first electrical connection of the battery, no station signal strength information is available. As another example, the radio may conduct a limited search in the event that the user triggers the Seek operation before station signal strength data collection has been completed. If the collected sample size is below a certain value, then the calibrated threshold may be utilized until signal strength data of n stations has been collected. The threshold as well as the value of n may be calibratable. For instance, if signal strength data of 102 frequencies has been collected based on the U.S. region, then operation may proceed in the full band search mode.

However, when the sample size does not encompass the entire spectrum range, the following unbiased standard deviation estimator may be utilized:

$$\sigma = \left(\left(\sqrt{\frac{1}{n(n-1)}(\sum x^2 - (\sum x)^2)}\right)\right) \quad (3)$$

The dynamic higher bound threshold value for the field strength may be computed using the following formula:

$$\text{Threshold} = \bar{x} = \left(\frac{1}{n}\left(\sum x\right)\right) \quad (4)$$

Generally, based upon the data that is gathered, the present invention may determine or compute whether the radio is situated in an environment that is suitable for a low sensitivity setting or a high sensitivity setting. The standard deviation is an indication of how disparately the signal strengths of the frequencies vary about the mean average. For example, urban areas typically host stations which have strong field strengths. The consistency of the strong field strengths across the range of frequencies may result in low standard deviation values.

The present invention may determine whether the region in which the radio is disposed is appropriate for low sensitivity or high sensitivity. In a first scenario, the collected field strength data has a high standard deviation and the number of stations above a certain field strength (e.g., 28 dBuV) is below a threshold number of stations, which indicates low sensitivity operation would be appropriate. The threshold number of stations may be a calibratable value.

In a second scenario, the collected field strength data has a low standard deviation and the number of stations above a certain field strength (e.g., 28 dBuV) is below a threshold number of stations, which indicates low sensitivity operation would be appropriate. The threshold number of stations may be a calibratable value. The first and second scenarios described above may be characteristic of localities that are on the outskirts of city areas and that may be considered suburban areas.

In a third scenario, the collected field strength data has a low standard deviation and the number of stations above a certain field strength (e.g., 28 dBuV) is above a threshold number of stations. In this and in all other scenarios, high sensitivity operation may be appropriate. The threshold number of stations may be a calibratable value. This third scenario may be characteristic of an urban area that generally has strong signal strengths which may be due to transmitter networks being present in the local vicinity or having repeaters on the roofs of buildings. Suburban and rural areas typically do not have repeaters that amplify the signals.

The present invention may enable the radio to determine the sensitivity of the radio's present locality to power moding states within the radio. In order to enhance the efficiency of this scan, on a cold start or first battery connect, the radio may start the scan before the accessory (ACC) is switched to ON. For example, the scanning may be performed before an accessory switch of the vehicle is initially turned on after the radio is installed in a vehicle. This may enable background scanning that is transparent to the end user. Upon the accessory (ACC) being switched to OFF, the radio may perform the scan to update its gathered statistics prior to complete shutdown wherein the radio may go into a HALT state (i.e., a low current draw sleep state).

In order to inhibit or prevent checks from being performed back to back or consecutively, which can result in the user perceiving the audio mute, a one-shot timer may be set each time a check is performed. The setting of the one-shot timer may ensure that even if there were to be a pause detect trigger immediately after a previous pause detect triggered check has been performed, the second check would be performed only if this timer has elapsed. This consecutive check prevention one-shot timer may be calibratable.

In order to enhance efficiency in the quality sample checks, a timer may be utilized when quality is computed. The timer may be decremented using speed information provided by a vehicle local area network. As soon as a station has been sampled for quality, a timer associated with that particular station may be set. As long as the timer is valid (i.e., has a non-zero value), a quality check may not be performed again on that station. Once the timer decrements to zero however, another quality check may be performed.

The timer may be decremented either by periodic timer tick or through speed information provided by the local area network within the car. The timer decrement via speed information may be particularly advantageous in one embodiment because if the vehicle is stationary there is no decrement of the timer. The rate of decrement may be dependent upon the speed of the vehicle.

In one embodiment, the present invention may utilize perceptually weighted checks. In order to complement the pause detect logic check, the present invention may include triggering an alternate frequency check when the currently listened-to station has poor reception quality. That is, when the currently listened-to station has poor reception quality, the present invention may "sneak in" a check that is not easily perceived by the user. To allow for the additional check, the present invention may utilize a perceptual weighting filter based on a quality parameter. The perceptually weighted checks may take advantage of the poor signal reception of the presently listened-to station to perform checks.

To support the additional quality check, in one embodiment, a one-shot timer with a duration of about 500 milliseconds is used to continuously check on the current quality state. If the quality check indicates noise, and if a quality check was not performed within the previous one second time frame, then a quality check is initiated.

The perceptual filter utilized by the present invention may include a three-dimensional function which inputs field strength, multipath and ultrasonic noise into a quality factor. The three parameters may be received from the DSP through autoincrement registers.

In one embodiment, the parameters of field strength, multipath and ultrasonic noise as read from the DSP all lie in a normalized range with values ranging from 0 to 100. Creating and storing a 100 by 100 by 100 quality table of values would consume an excessive amount of ROM memory in the microcontroller. Operating at full scale of 100% is not required because distortion of audio is usually perceived at a range from 0 to 25%. Based on empirical listening tests, it has been found that grouping the scale value within segments in the 0 to 25% range may be most efficient because, from the user's point of view, no difference may be perceived between distortion at 24% and distortion at 25%. As an example of normalizing multipath and ultrasonic noise from the DSP, this 0 to 25% range may be broken down into a level of 0, 1 or 2 for each of the parameters as follows:

Level 0 for Multipath—contains multipath values from 0 to 10%.

Level 1 for Multipath—contains multipath values from 11 to 20%.

Level 2 for Multipath—contains multipath values from 20 to 25%.

Similarly, for ultrasonic noise, the 0 to 25% range may be broken down into a level of 0, 1 or 2 in the following manner:

Level 0 for Ultrasonic Noise—contains ultrasonic noise values from 0 to 15%.

Level 1 for Ultrasonic Noise—contains ultrasonic noise values from 15 to 20%.

Level 2 for Ultrasonic Noise—contains ultrasonic noise values from 20 to 25%.

In one embodiment, the ranges are calibratable. Field strength may be the most important parameter in the quality table because it is proportional to the strength of reception. Field strength may be normalized to units of 5 dBuV and may have an upper level cap of 80 dBuV, resulting in sixteen possible field strength values.

Thus, the size of the quality table may be set at sixteen field strength values by three multipath values by three ultrasonic noise values. However, these table size parameters may be calibratable. The quality table may vary based on the antenna type used by the vehicle, namely, a passive antenna, an active antenna or a diversity antenna.

The present invention has been described herein as being applied to a single tuner audio system. However, it is to be understood that the present invention may be implemented in either a dual tuner environment or a single tuner environment.

In a dual tuner system with external diversity, one of the tuners can be dedicated for background scanning. The signal parameters may be low pass filtered via an infinite impulse response filter for purposes of averaging. A hysteresis of one second can be used for the signal parameterization checks. About three checks, on average, may be made. The checks may be spaced out at 50 millisecond intervals all while in FM source with the user listening to a station. That is, because a subtuner is constantly engaged in background scanning, the primary tuner may allow the user to listen to a desired station or stations in an uninterrupted manner.

In a dual tuner system with phase diversity, one of the tuners may be dedicated for background scanning if the signal reception on the other antenna is perceived to be good. The signal parameters may be low pass filtered via an infinite impulse response filter for purposes of averaging. A hysteresis of one second can be used for the signal parameterization checks. About three checks, on average, may be made. The checks may be spaced out at 50 millisecond intervals all while in FM source with the user listening to a station. However, in cases where the signal reception is poor, both antennas may be used in order to provide better signal reception due to phase diversity. In this case, signal checks of neighboring frequencies may be performed only if the pause detect methodology is utilized.

In a single tuner system, to avoid the check being perceived, only one check is typically performed per detected pause or through the perceptually weighted checks if the radio is sourced to Tuner FM Source. However, if the user is sourced to a non-Tuner source, the single tuner may apply infinite impulse response (IIR) averaged signal parameterization checks since the user is not listening to the Tuner source.

Figure 4A:
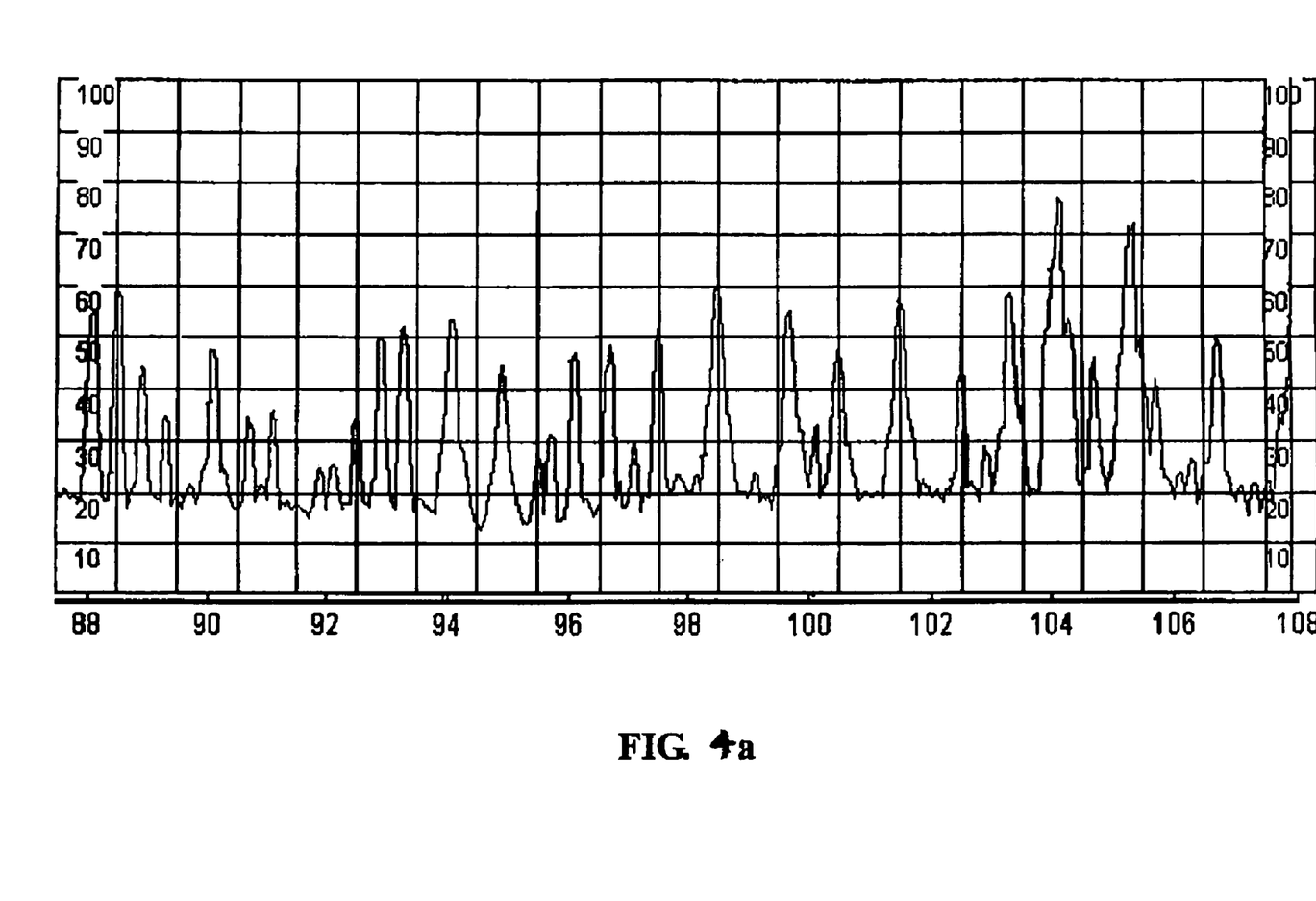
FIG. 4a is an exemplary plot of field strength versus FM frequency as measured in a scan of FM frequencies in one embodiment of a method of the present invention.
Figure 4B:
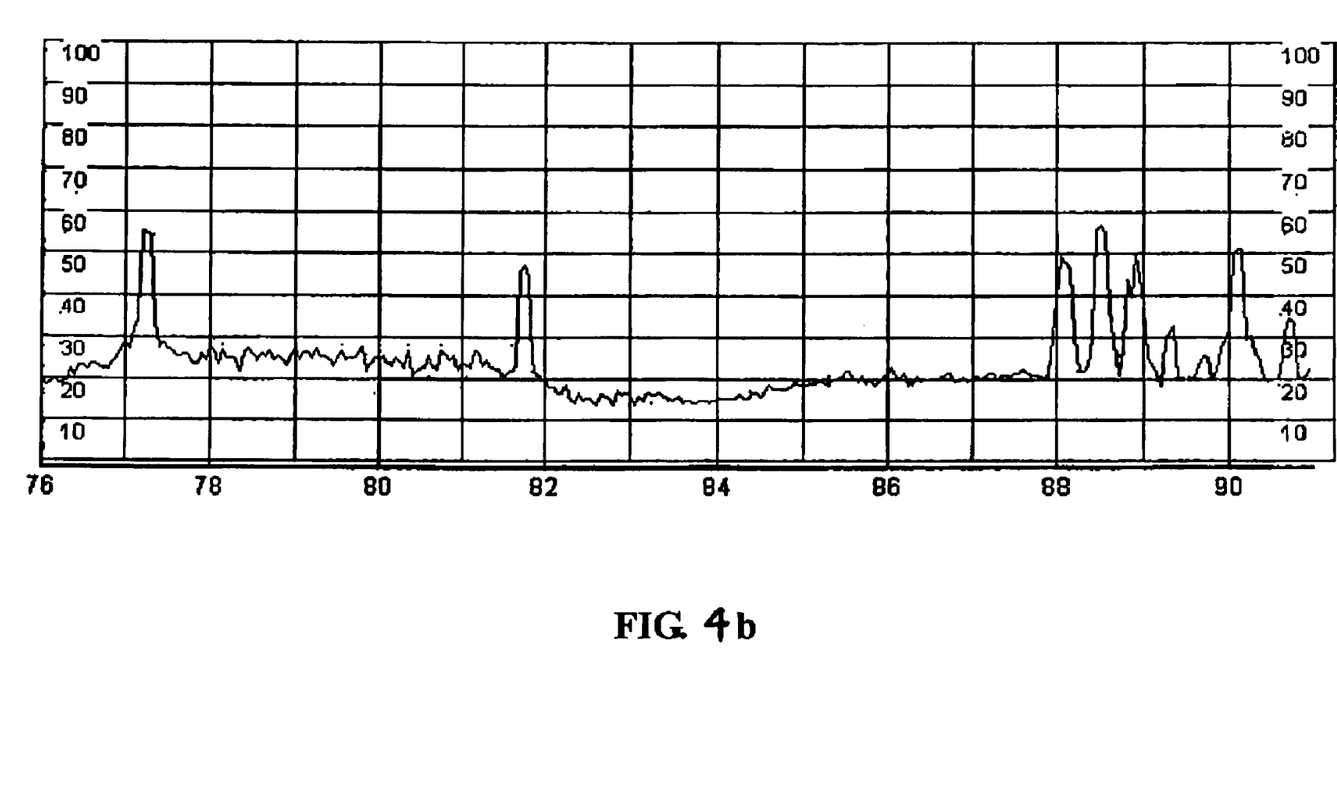
FIG. 4b is another exemplary plot of field strength versus FM frequency as measured in a scan of FM frequencies in one embodiment of a method of the present invention.

FIGS. 4a-b are plots of field strength versus frequency, wherein the x-axis represents frequency, and the y-axis represents field strength in dB micro volts, for bandscans taken at the Panasonic Software Design Center in Peachtree City, Ga. In particular, FIG. 4a corresponds to an FM bandscan with 100 kHz frequency step, in the range of 87.5 to 108 MHz; and FIG. 4b corresponds to an FM bandscan with 100 kHz frequency step, in the range of 76 to 90 MHz.

Figure 5:
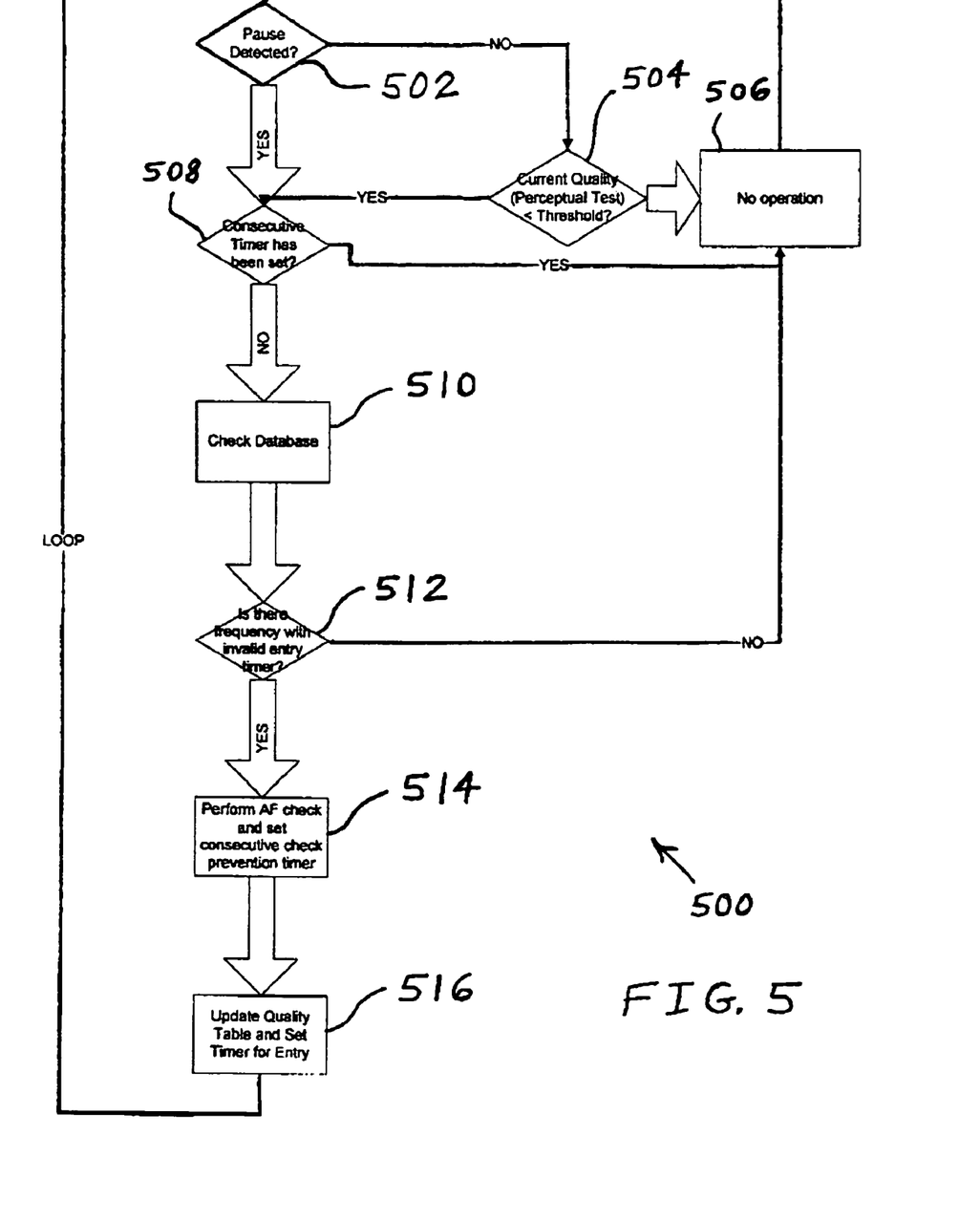
FIG. 5 is a flow chart of one embodiment of a method of the present invention for performing quality checks.

One embodiment of a method 500 of the present invention for performing quality checks is illustrated in FIG. 5. In a first step 502, it is determined whether a pause is detected in the signal that is being listened to currently. In one embodiment, a pause is recognized when it has lasted at least 40 milliseconds.

If a pause is not detected, then in step 504 it is determined whether the quality of the signal that is currently listened to is less than a threshold level. If the quality of the signal that is currently listened to is greater than the threshold level, then no operation is performed, as indicated at step 506, and operation returns to step 502.

If, however, a pause is detected in step 502, or if the quality of the current signal is found to be less than the threshold in step 504, then, in step 508, it is determined whether the consecutive timer has been set. That is, it is determined whether a one-shot timer is currently running, which indicates that a quality check is currently being performed. In order to avoid performing back to back quality checks, which would silence the audio for a period of time that is long enough to be noticed by the listener, no operation is performed if the consecutive timer has been set, as indicated at step 506.

If, in step 508, it is determined that the consecutive timer has not been set, then the database is checked (step 510) and it is determined in step 512 whether there is a frequency with an invalid entry timer. That is, as soon as a station has been sampled for quality, an entry timer associated with that particular station may be set. As long as the timer is valid (i.e., has a non-zero value), a quality check may not be performed again on that station. Once the timer decrements to zero however, and thereby becomes invalid, another quality check may be performed. Thus, if it is determined in step 512 that there is no frequency with an invalid entry timer, then operation proceeds to step 506, where no operation is undertaken. On the other hand, if it is determined in step 512 that there is a frequency with an invalid entry timer, then operation proceeds to step 514.

In step 514, an audio frequency check is performed, and a consecutive check prevention timer is set. For example, a quality sample check may be performed to gather readings of the three parameters of fieldstrength, multipath and ultrasonic noise at a given audio frequency. In order to inhibit or prevent checks from being performed back to back or consecutively, which can result in the user perceiving the audio mute, a consecutive check prevention timer may be set each time a check is performed. The setting of the consecutive check prevention timer may ensure that even if there were to be a pause detect trigger immediately after a previous pause detect triggered check has been performed, the second check would be performed only if this timer has elapsed.

In a final step 516, a quality table is updated and a timer for entry is set. The quality table may be updated with values of field strength, multipath and ultrasonic noise for each audio frequency. As described above with regard to step 512, as soon as a station has been sampled for quality, an entry timer associated with that particular station may be set with a non-zero value and thereafter begins to decrement. As long as the timer has a non-zero value, a quality check may not be performed again on that station. But once the timer decrements to zero, another quality check may be performed. At the completion of step 516, operation returns to step 502 and the process described above may be repeated indefinitely.

Figure 6:
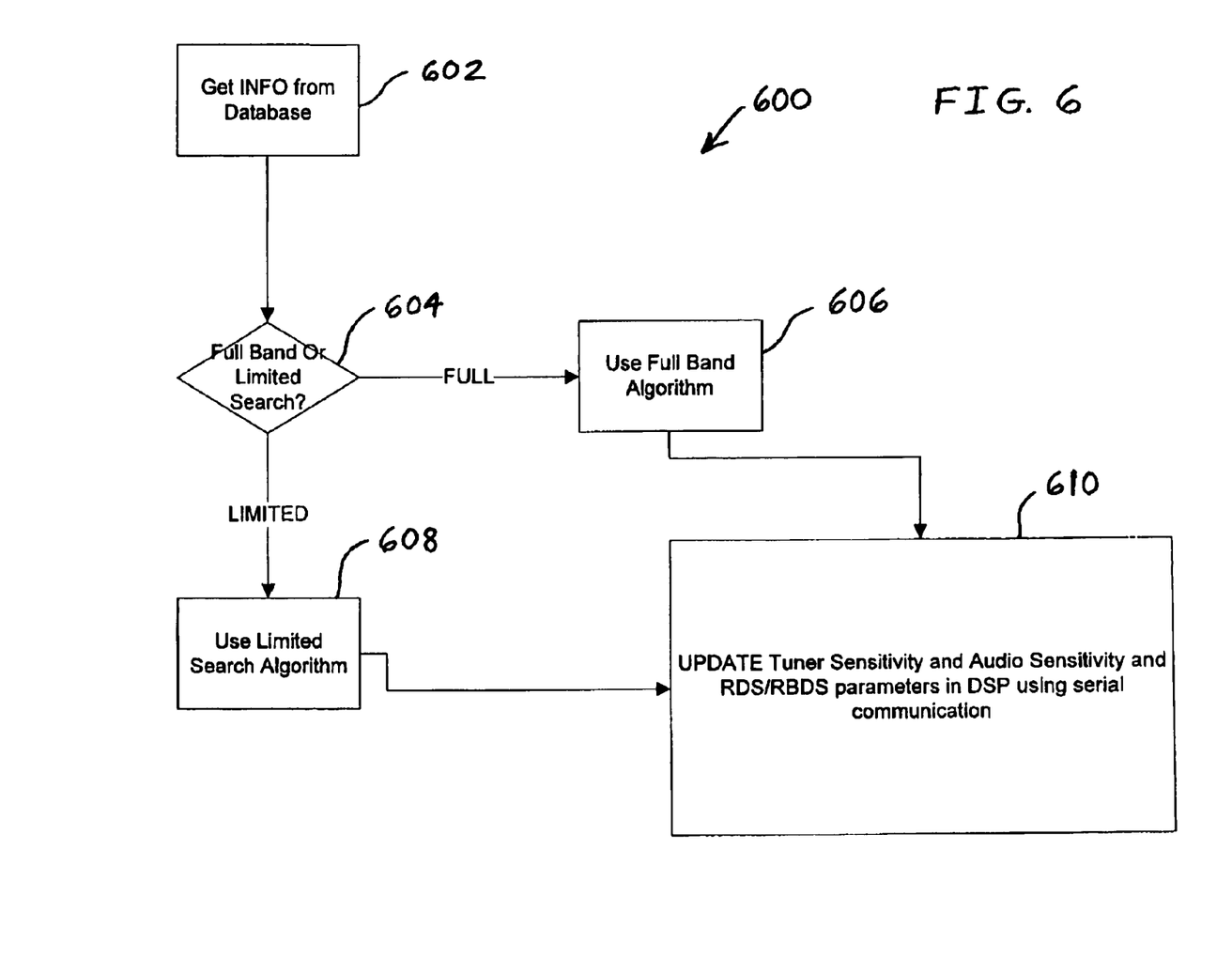
FIG. 6 is a flow chart of one embodiment of a decision analysis method of the present invention.

A decision analysis method 600 of the present invention that may occur in conjunction with steps 510, 512, 514 and 516 of FIG. 5 is illustrated in FIG. 6. In a first step 602, information is retrieved from the database. The retrieved information may include a list of frequencies that are due to have their qualities checked. In one embodiment, a ten second timer may run in the background, and updates to tuner sensitivity, audio sensitivity, and RDS/RBDS parameters may be made when the ten second timer expires. In a next step 604, it is decided whether a full band or limited search is to be conducted. This decision may depend upon the current mode that the radio is in, and whether enough time is available to perform a full band search without the listener noticing. Regardless of whether a full band search (step 606) or a limited search (step 608) is conducted, tuner sensitivity, audio sensitivity, and RDS/RBDS parameters may be updated in the DSP by use of serial communication (step 610).

Figure 7:
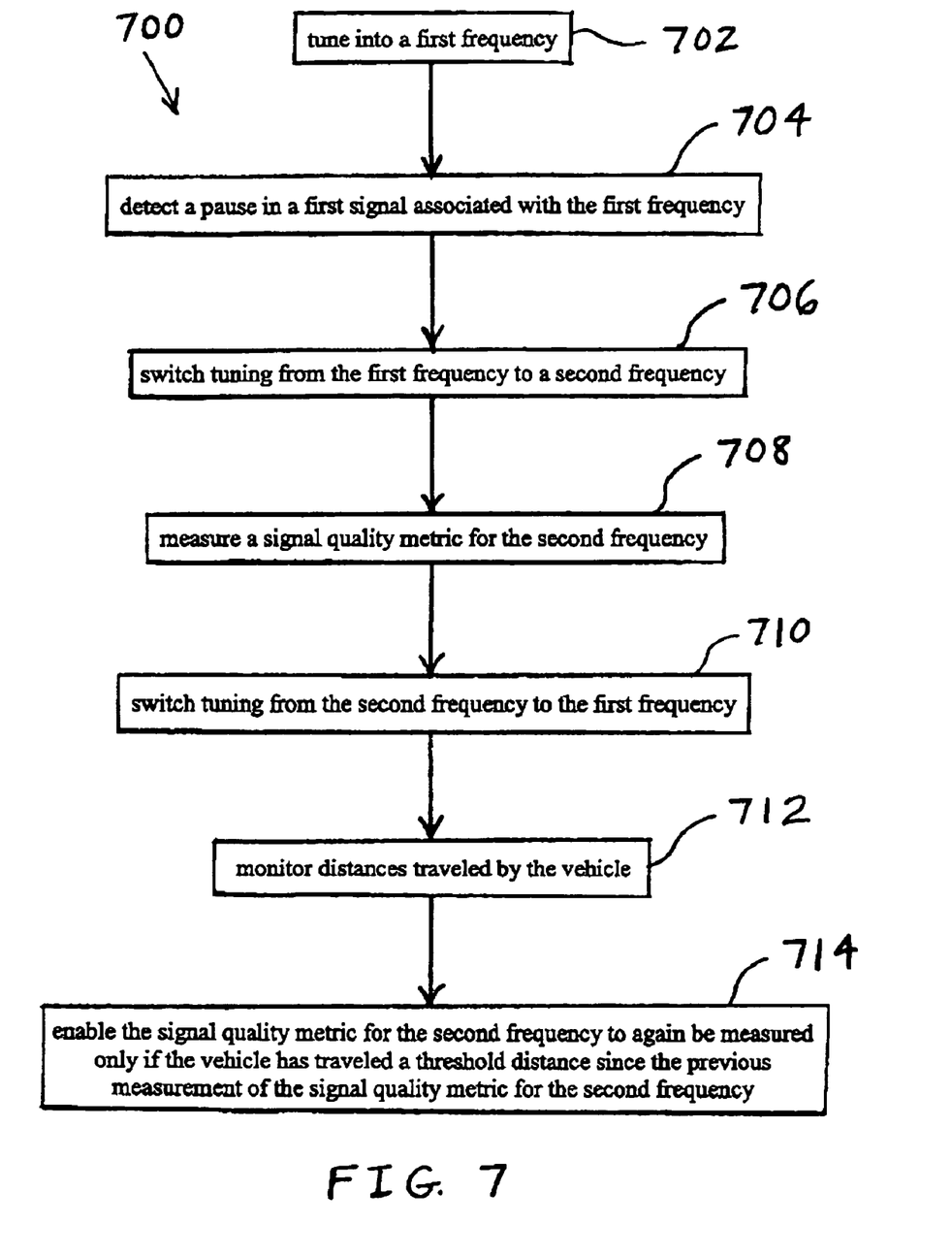
FIG. 7 is a flow chart of one embodiment of a method of the present invention for operating a radio within a vehicle.

One embodiment of a method 700 of the present invention for operating a radio within a vehicle is illustrated in FIG. 7. In a first step 702, a first frequency is tuned into. That is, a passenger within the vehicle may set the tuning frequency of the radio to match a broadcast frequency of a certain desired radio station. Next, in step 704, a pause in a first signal associated with the first frequency is detected. In one embodiment, a lack of content in the currently listened-to frequency that lasts at least 40 milliseconds is recognized as a pause. In a next step 706, tuning is switched from the first frequency to a second frequency. That is, immediately after a pause is recognized, the tuner may switch its tuning from the currently listened-to frequency to another frequency whose quality is to be checked. In step 708, a signal quality metric for the second frequency is measured. For example, the signal quality metrics of multipath, signal strength, and ultrasonic noise may be measured for the frequency whose quality is to be checked. Next, in step 710, tuning is switched from the second frequency to the first frequency. That is, immediately after the quality of the other frequency has been checked, the tuner may switch its tuning back to the currently listened-to frequency. Distances traveled by the vehicle are monitored in a next step 712. In one embodiment, the distance traveled is monitored using a one-shot timer in conjunction with speed information received from a vehicle computer. In another embodiment, the directions traveled by the vehicle are also taken into account such that it may be determined how far the vehicle is from the location at which the radio last performed a quality check on a particular frequency. In a final step 714, the signal quality metric for the second frequency is enabled to again be measured only if the vehicle has traveled a threshold distance since the previous measurement of the signal quality metric for the second frequency. That is, if the distance traveled by a vehicle since the previous quality check for a particular frequency is great enough that the signal quality may be substantially different, then another measurement of the signal quality metric may be performed.

Figure 8:
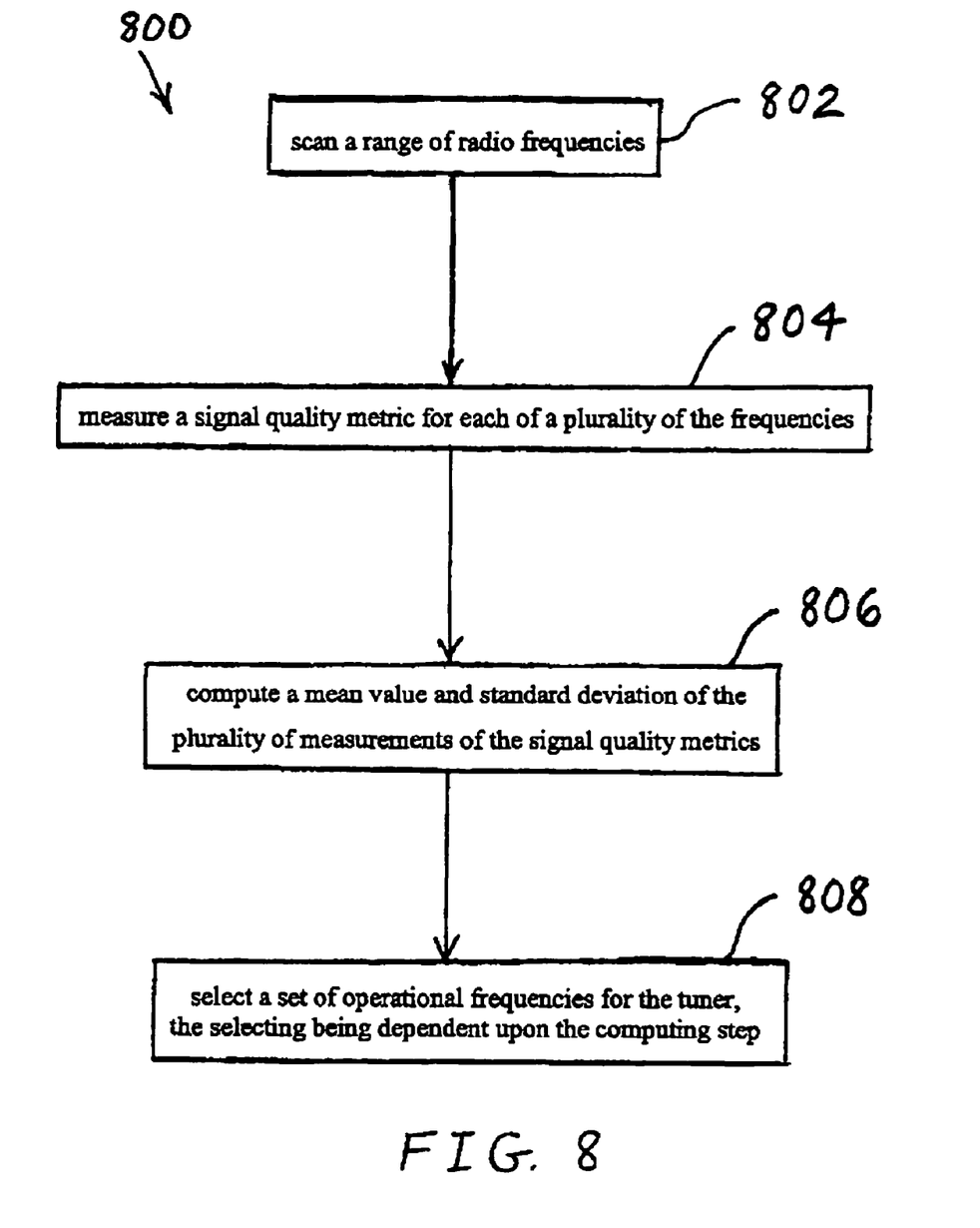
FIG. 8 is a flow chart of one embodiment of a method of the present invention for configuring a tuner.

A method 800 of the present invention for configuring a tuner is illustrated in FIG. 8. In a first step 802, a range of radio frequencies is scanned. For example, in a full band search, 102 frequencies may be checked in a U.S. region. In a next step 804, a signal quality metric is measured for each of a plurality of the frequencies. In one embodiment, field strength is measured for each of the 102 frequencies. In step 806, a mean value and standard deviation of the plurality of measurements of the signal quality metrics is computed. For example, the standard deviation and mean value of field strength measurements may be calculated by formulas (1) and (2) discussed above. In a final step 808, a set of operational frequencies is selected for the tuner, the selecting being dependent upon the computing step. For example, frequencies to be included in a Seek Stop operation may be selected based upon how their field strengths compare to the mean value, and based upon how their field strengths compare to a standard deviation from the mean value.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of operating a single-tuner radio, comprising the steps of:
    tuning into a first frequency;
    detecting a pause in a first signal associated with the first frequency;
    switching tuning from the first frequency to a second frequency after the pause has been detected;
    measuring a signal quality metric for the second frequency;
    switching tuning from the second frequency to the first frequency;
    setting a timer after the measuring step;
    periodically decrementing the timer based upon vehicle speed;
    inhibiting further measurement of the signal quality metric for the second frequency before the timer has decremented to zero; and
    allowing further measurement of the signal quality metric for the second frequency after the timer has decremented to zero.

2. The method of claim 1 comprising the further step of selecting a set of operational frequencies for the tuner, said selecting being dependent upon the measuring step.

3. The method of claim 2 wherein the selecting step includes selecting a set of operational frequencies to maximize a number of broadcast stations from which the tuner may receive signals of an acceptable quality.

4. The method of claim 1 wherein the signal quality metric is dependent upon at least one of field strength, level of multipath, and ultrasonic noise.

5. The method of claim 4 comprising the further steps of:
    storing measurements of field strength, level of multipath, and ultrasonic noise in three respective memory locations; and
    retrieving the measurements of field strength, level of multipath, and ultrasonic noise from the three respective memory locations with a single I2C read.

6. The method of claim 1 wherein a tuning voltage associated with tuning into the second frequency is dependent upon a frequency difference between the first frequency and the second frequency.

7. A method of operating a single-tuner radio, comprising the steps of:
    tuning into a first frequency;
    detecting a pause in a first signal associated with the first frequency;
    switching tuning from the first frequency to a second frequency after the pause has been detected;
    measuring a signal quality metric for the second frequency during the pause;
    switching tuning from the second frequency to the first frequency;

setting a timer after the measuring step;
periodically decrementing the timer based upon vehicle speed;
inhibiting further measurement of the signal quality metric for the second frequency before the timer has decremented to zero; and
allowing further measurement of the signal quality metric for the second frequency after the timer has decremented to zero.

8. The method of claim 7 wherein the signal quality metric is dependent upon at least one of field strength, level of multipath, and ultrasonic noise, the method comprising the further steps of:

storing measurements of field strength, level of multipath, and ultrasonic noise in three respective memory locations; and
retrieving the measurements of field strength, level of multipath, and ultrasonic noise from the three respective memory locations with a single I2C read.

9. The method of claim 7 wherein a tuning voltage associated with tuning into the second frequency is dependent upon a frequency difference between the first frequency and the second frequency.

* * * * *

UNITED STATES PATENT AND TRADEMARK OFFICE
CERTIFICATE OF CORRECTION

PATENT NO. : 8,406,715 B2
APPLICATION NO. : 12/079528
DATED : March 26, 2013
INVENTOR(S) : Shree Jaisimha et al.

It is certified that error appears in the above-identified patent and that said Letters Patent is hereby corrected as shown below:

On the Title Page, Item (73) Assignee should read as follows:

Panasonic Automotive Systems of America, Division of Panasonic Corporation of North America In the Specifications:

Col. 8, Line 38 should read as follows:

the n frequencies computed in the scan, and σ is the standard

Signed and Sealed this
Eighteenth Day of June, 2013

Teresa Stanek Rea
*Acting Director of the United States Patent and Trademark Office*